(12) United States Patent
An et al.

(10) Patent No.: US 11,625,524 B2
(45) Date of Patent: Apr. 11, 2023

(54) INTEGRATED CIRCUIT AND METHOD OF DESIGNING A LAYOUT THEREOF

(71) Applicant: Samsung Electronics Co., Ltd., Suwon-si (KR)

(72) Inventors: Hyo-joon An, Suwon-si (KR); Hyung-woo Yu, Hwaseong-si (KR); Sun-ah Kim, Yongin-si (KR); Jae-woo Yang, Ulsan (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 879 days.

(21) Appl. No.: 16/516,429

(22) Filed: Jul. 19, 2019

(65) Prior Publication Data
US 2020/0218146 A1    Jul. 9, 2020

(30) Foreign Application Priority Data

Jan. 8, 2019   (KR) .................. 10-2019-0002405

(51) Int. Cl.
| | | |
|---|---|---|
| *G06F 30/392* | (2020.01) | |
| *G03F 1/70* | (2012.01) | |
| *H01L 21/311* | (2006.01) | |
| *G06F 30/398* | (2020.01) | |
| *H01L 27/02* | (2006.01) | |
| *G06F 30/394* | (2020.01) | |

(52) U.S. Cl.
CPC .............. *G06F 30/392* (2020.01); *G03F 1/70* (2013.01); *G06F 30/394* (2020.01); *G06F 30/398* (2020.01); *H01L 21/31144* (2013.01); *H01L 27/0207* (2013.01)

(58) Field of Classification Search
CPC ..................................................... G06F 30/392
USPC ........................................................ 716/122
See application file for complete search history.

(56) References Cited

U.S. PATENT DOCUMENTS

| | | | |
|---|---|---|---|
| 8,954,913 | B1 | 2/2015 | Yuan et al. |
| 9,093,378 | B2 | 7/2015 | Kim et al. |
| 9,098,670 | B2 | 8/2015 | Song et al. |
| 9,274,413 | B2 | 3/2016 | Tung |
| 9,335,626 | B2 | 5/2016 | Lafferty et al. |
| 9,425,049 | B2 | 8/2016 | Huang et al. |
| 9,524,361 | B2 | 12/2016 | Tseng et al. |
| 9,558,947 | B2 | 1/2017 | Wallace et al. |
| 9,582,629 | B2 | 2/2017 | Yuan et al. |
| 9,620,380 | B1 | 4/2017 | Dai et al. |
| 9,652,578 | B2 | 5/2017 | Kim et al. |
| 9,672,309 | B2 | 6/2017 | Wang et al. |

(Continued)

*Primary Examiner* — Eric D Lee
(74) *Attorney, Agent, or Firm* — Muir Patent Law, PLLC

(57) ABSTRACT

An integrated circuit includes a first region corresponding to a first circuit and including a first dummy pattern and a first signal pattern which are spaced apart from each other by a width of a spacer in a conductive layer to extend in parallel in a first horizontal direction and a second region corresponding to a second circuit which is the same as the first circuit and including a second dummy pattern and a second signal pattern which are spaced apart from each other by the width of the spacer in the conductive layer to extend in parallel in the first horizontal direction. The first signal pattern and the second signal pattern are configured so that a first signal and a second signal corresponding to each other in the first circuit and the second circuit are respectively applied to the first signal pattern and the second signal pattern.

20 Claims, 11 Drawing Sheets

(56) References Cited

U.S. PATENT DOCUMENTS

| | | | |
|---|---|---|---|
| 9,735,029 B1 * | 8/2017 | Chu | H01L 23/5222 |
| 9,811,626 B2 | 11/2017 | Jeong et al. | |
| 9,941,164 B1 | 4/2018 | Kim | |
| 9,946,827 B2 | 4/2018 | Wang et al. | |
| 2016/0372468 A1 * | 12/2016 | Wang | H01L 27/027 |
| 2020/0126911 A1 * | 4/2020 | Li | H01H 69/022 |

* cited by examiner

INTEGRATED CIRCUIT AND METHOD OF DESIGNING A LAYOUT THEREOF

CROSS-REFERENCE TO RELATED APPLICATION

This application claims the benefit of Korean Patent Application No. 10-2019-0002405, filed on Jan. 8, 2019, in the Korean Intellectual Property Office, the disclosure of which is incorporated herein in its entirety by reference.

BACKGROUND

The inventive concept relates to an integrated circuit, and more particularly, to an integrated circuit including patterns formed through self-aligned patterning and a method of designing a layout of the integrated circuit.

In order to enhance a degree of integration of each integrated circuit, it is required to form a fine pattern. Various methods may be used for overcoming a limitation in patterning based on photolithography. For example, double patterning (or multi-patterning) may denote a process of grouping patterns into an odd group and an even group and repeatedly performing lithography and etching on each of the groups. As another example, self-aligned double patterning (SADP) may denote a process of separating patterns by using a spacer to form patterns. Various methods of forming a fine pattern may provide patterns having a reduced pitch, but may adversely affect the performance of an integrated circuit.

SUMMARY

The inventive concept provides an integrated circuit, which has a structure for solving problems caused by a process of forming a fine pattern, and a method of designing a layout of the integrated circuit.

According to an example embodiment, the disclosure is directed to an integrated circuit comprising: a first region corresponding to a first circuit and comprising a first dummy pattern and a first signal pattern which are spaced apart from each other by a predetermined width in a conductive layer and extend in parallel in a first horizontal direction; and a second region corresponding to a second circuit which is identical to the first circuit and comprising a second dummy pattern and a second signal pattern which are spaced apart from each other by the predetermined width in the conductive layer and extend in parallel in the first horizontal direction, wherein the first signal pattern and the second signal pattern are configured so that a first signal and a second signal corresponding to each other in the first circuit and the second circuit are respectively applied to the first signal pattern and the second signal pattern, and wherein the predetermined width corresponds to a width of a spacer.

According to an example embodiment, the disclosure is directed to a method of manufacturing an integrated circuit, the method comprising: obtaining information about a first signal pattern and a second signal pattern having the same shape in a conductive layer; placing in a design layout the first signal pattern and the second signal pattern each extending in a first horizontal direction; placing in the design layout a first dummy pattern which is spaced apart from the first signal pattern by a first pitch and extends in the first horizontal direction; placing in the design layout a second dummy pattern which is spaced apart from the second signal pattern by the first pitch and extends in the first horizontal direction; and forming the integrated circuit based on the design layout, the integrated circuit comprising first and second signal patterns that correspond to the first and second signal patterns of the design layout and first and second dummy patterns that correspond to the first and second dummy patterns of the design layout, wherein the first pitch corresponds to a pitch between a mandrel pattern and a non-mandrel pattern.

According to an example embodiment, the disclosure is directed to a method of manufacturing an integrated circuit, the method comprising: obtaining information about a signal pattern comprised in a critical path; placing in a design layout the signal pattern extending in a first horizontal direction; placing in the design layout a first dummy pattern which is spaced apart from the signal pattern by a first pitch and extends in the first horizontal direction; and forming the integrated circuit based on the design layout, the integrated circuit comprising a signal pattern that corresponds to the signal pattern of the design layout and a first dummy pattern that corresponds to the first dummy pattern of the design layout, wherein the first pitch corresponds to a pitch between a mandrel pattern and a non-mandrel pattern, and wherein the placing of the first dummy pattern comprises determining a width of the first dummy pattern, based on a width of the signal pattern and the first pitch.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
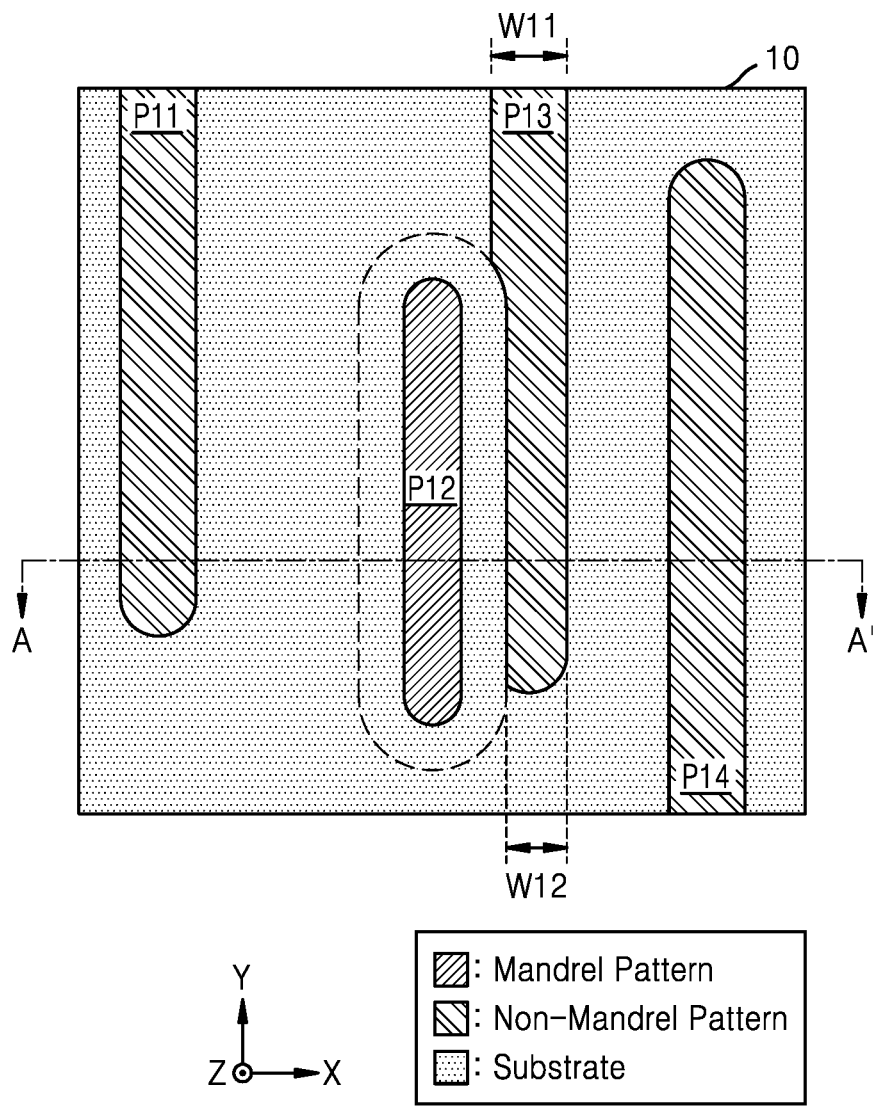
FIGS. 1 and 2 are diagrams illustrating a portion of an integrated circuit, according to an exemplary embodiment.
Figure 2:
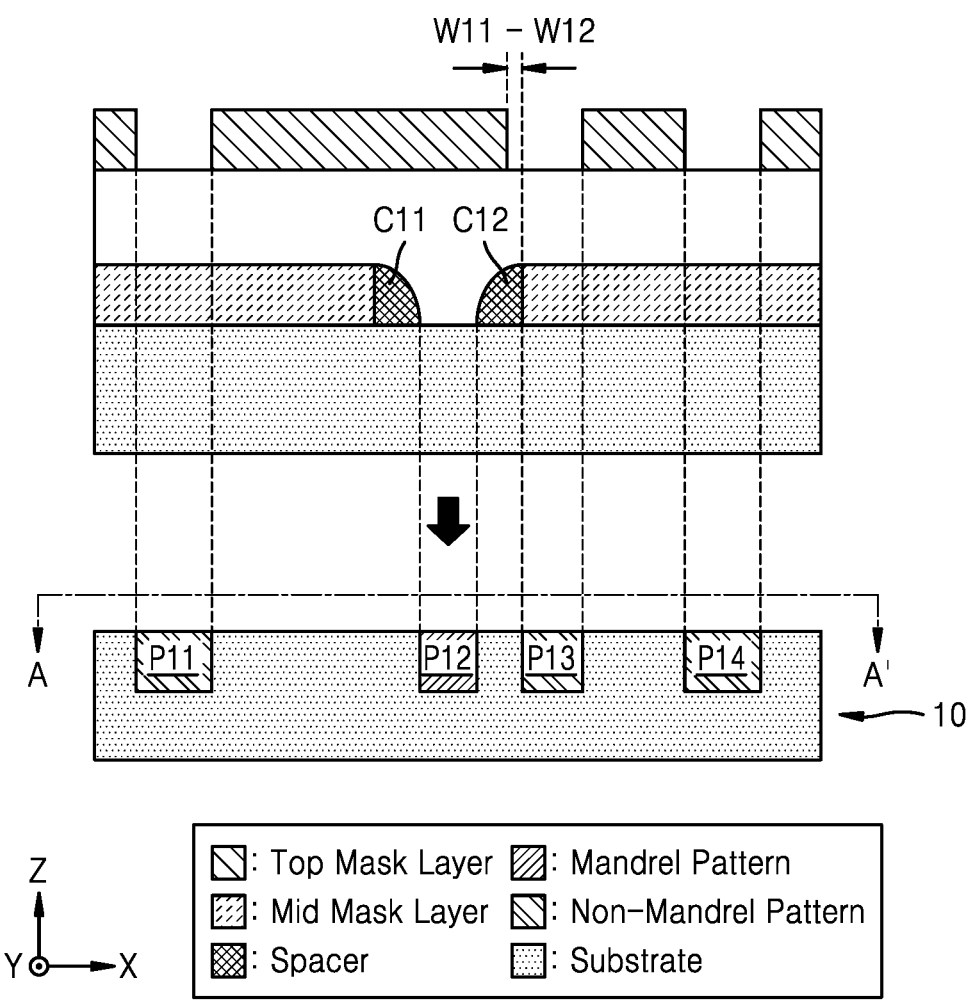

FIGS. 1 and 2 are diagrams illustrating a portion of an integrated circuit 10 according to an exemplary embodiment. In detail, FIG. 1 is a plan view illustrating a layout of the integrated circuit 10 including a plurality of patterns P11 to P14 provided in the same conductive layer with respect to a plane based on an X axis and a Y axis, and FIG. 2 illustrates a cross-sectional view (a lower section of FIG. 2) of the integrated circuit 10, taken along line A-A' of the plan view of FIG. 1 and a portion (an upper section of FIG. 2) of a process of manufacturing the integrated circuit 10.

Herein, an X-axis direction may be referred to as a first horizontal direction, a Y-axis direction may be referred to as a second horizontal direction, and a Z-axis direction may be referred to as a vertical direction. The first horizontal direction, the second horizontal direction, and the vertical direction may be perpendicular to one another. A plane based on the X axis and the Y axis may be referred to as a horizontal plane, an element disposed in a +Z direction with respect to another element may be referred to as being on the other element, and an element disposed in a −Z direction with respect to another element may be referred to as being under the other element. Unless described herein, a length of an element may denote a length in an extending direction, and a width of an element may denote a length in a direction vertical to the extending direction, where the length is greater than a width. Also, an area of an element may denote a size, occupied by the element, of a plane parallel to a horizontal plane. In the drawings, only layers may be illustrated for convenience of illustration.

In one conductive layer, patterns may extend in a predetermined direction. For example, as illustrated in FIG. 1, first to fourth patterns P11 to P14 may extend lengthwise in parallel in a Y-axis direction in the integrated circuit 10. A pitch may denote a distance between centers of patterns which extend adjacent to each other in the same conductive layer. When a pitch of patterns included in the integrated circuit 10 is reduced, relatively more patterns can be integrated into the integrated circuit 10. Accordingly, various techniques for decreasing a pitch of patterns may be applied.

In order to overcome a limitation in patterning based on photolithography, double patterning (or multi-patterning) may be applied. The double patterning may denote a process of grouping patterns into an odd group and an even group and repeatedly performing lithography and etching on each of the groups, and for example, may be referred to as litho-etch-litho-etch (LELE). However, due to an overlay or a distribution of critical dimension uniformity (CDU), a pattern bridge may occur between a pattern formed by first litho-etch (LE) and a pattern formed by second LE.

Self-aligned double patterning (SADP) may use spacers, and thus, may prevent a pattern bridge from occurring in the double patterning. Self-aligned patterning may deposit spacers (e.g., atomic layer deposition (ALD) spacers) on a side surface of a pattern formed by mandrel and may perform double patterning (or multi-patterning) by using space(s) between the spacers. However, because a deposition thickness of a spacer may not be changeable in the same process, controlling of a space formed by a spacer may not be easy in the SADP. For example, in the same process, the spacers may all have the same deposition thickness.

In order to overcome a limitation of the SADP, self-aligned litho-etch-litho-etch (SA-LELE) has been proposed in Korean Patent Application No. 10-2018-0041021, filed Apr. 9, 2018, in the Korean Intellectual Property Office, and U.S. patent application Ser. No. 16/185,137, filed Nov. 9, 2018, in the U.S. Patent and Trademark Office, the entire contents of both of which are incorporated herein by reference. According to the SA-LELE, lithography-etching for a mandrel pattern corresponding to a space between patterns may be performed, and lithography-etching for a non-mandrel pattern may be performed after a spacer is formed. For example, odd-numbered (or even-numbered) conductive lines of conductive lines extending in parallel in a conductive layer may be mandrel patterns, and even-numbered (or odd-numbered) conductive lines may be non-mandrel patterns. Therefore, a pitch of the mandrel pattern and a pitch of the non-mandrel pattern may be reduced, and moreover, a degree of freedom of patterning may increase. Herein, the mandrel pattern may be referred to as a self-aligned (SA) pattern, and the non-mandrel pattern may be referred to as a litho pattern.

Referring to FIG. 1, in the integrated circuit 10, the second pattern P12 may be a mandrel pattern, and the first pattern P11, the third pattern P13, and the fourth pattern P14 may be non-mandrel patterns. As described above, a shape of a mandrel pattern may be determined based on spacers, and a shape of a non-mandrel pattern may be determined based on lithography. Particularly, in addition to lithography, a shape of a non-mandrel pattern adjacent to a mandrel pattern may be determined based on a spacer which is used for forming the adjacent mandrel pattern. For example, as illustrated in FIG. 1, the third pattern P13, which is a non-mandrel pattern adjacent to the second pattern P2, which is a mandrel pattern, may have a shape where the third pattern P13 is removed from a region overlapping a region corresponding to a spacer used for forming the second pattern P12 as illustrated by a dashed line in a process of manufacturing the integrated circuit 10. Therefore, the third pattern P13 may have a first width W11 at a portion non-adjacent to the second pattern P12 and may have a second width W12, which is less than the first width W11, at a portion adjacent to the second pattern P12 (e.g., W11>W12).

Referring to FIG. 2, in a process of manufacturing the integrated circuit 10, a first spacer C11 and a second spacer C12 for the second pattern P12, which is a mandrel pattern, may be formed, and a top mask layer for forming non-mandrel patterns may be formed thereon. As illustrated in FIG. 2, a shape of each of the first and fourth patterns P11 and P14, which are non-mandrel patterns, may be determined based on the top mask layer, and the third pattern P13 may be affected by the second spacer C12 as well as the top mask layer.

Referring again to FIG. 1, a shape of a non-mandrel pattern such as the third pattern P13 may affect the performance of the integrated circuit 10. For example, a difference between the real performance of the integrated circuit 10 and a result of a post-simulation (e.g., operation S40 of FIG. 3), which is performed by using an estimated impedance of the third pattern P13 on the basis of a designed layout of the integrated circuit 10, may increase, and due to this, the integrated circuit 10 having unexpectedly reduced performance may be manufactured. Also, as described below with reference to FIGS. 6 and 7, in a process of designing a layout of the integrated circuit 10, two or more patterns designed in the same shape may have different shapes in the integrated circuit 10, and due to a mismatch between patterns, the performance of the integrated circuit 10 may be reduced. As described below with reference to the drawings, in the integrated circuit 10 and a method of designing a layout of the integrated circuit 10 according to an exemplary embodiment, patterns having a predictable shape may be formed in a semiconductor process of manufacturing the integrated circuit 10, and thus, the performance of the integrated circuit 10 may be ensured. Also, without correcting a semiconductor process, a pattern having a shape such as that of the third pattern P13 may not be formed in the process of designing the layout of the integrated circuit 10 for main signals which affect the performance of the integrated circuit 10.

Figure 3:
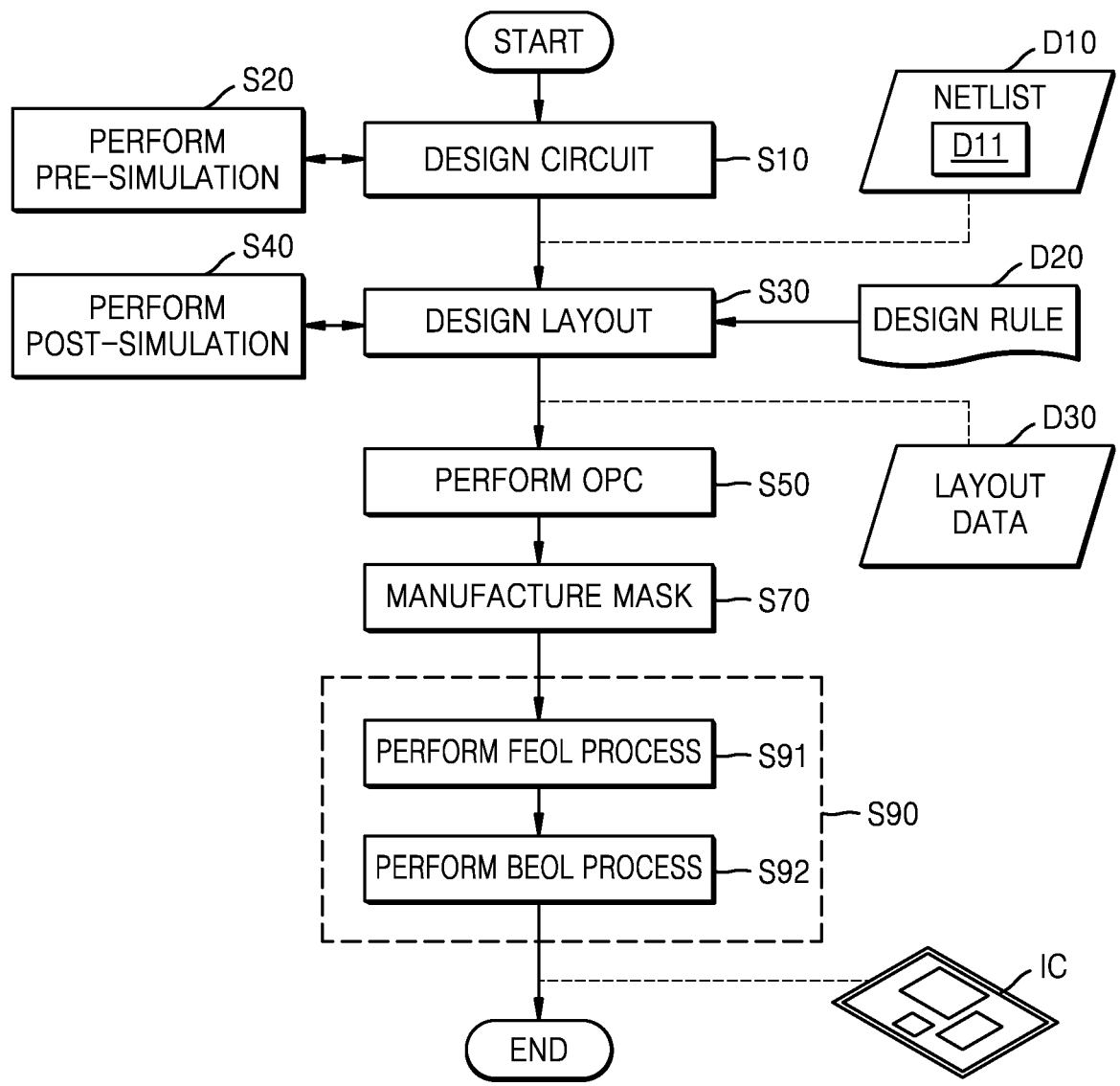
FIG. 3 is a flowchart illustrating a method of manufacturing an integrated circuit, according to an exemplary embodiment.

FIG. 3 is a flowchart illustrating a method of manufacturing an integrated circuit IC, according to an exemplary embodiment. As illustrated in FIG. 3, a method of manufacturing the integrated circuit IC may include a plurality of operations S10 to S90.

In operation S10, circuit designing may be performed. For example, some elements may be selected from among various optional elements (e.g., transistors, capacitors, resistors, etc.) so as to satisfy a target performance, and the selected elements may be connected to one another in a circuit design. In some embodiments, circuit designing may be performed by a designer using a circuit designing tool which provides a user interface. As illustrated in FIG. 3, in some embodiments, circuit designing may be performed with reference to a result of a pre-simulation which is performed in operation S20. The pre-simulation may be performed for testing the performance of a designed circuit, and a structure of the circuit may be corrected based on a pre-simulation result. When circuit designing, which satisfies target performance, is completed through the pre-simulation (e.g., operation S20), a netlist D10 defining the circuit may be generated as illustrated in FIG. 3.

The netlist D10 may define elements included in the circuit and a connection relationship between the elements. In some embodiments, the netlist D10 may further include additional information D11 about the circuit defined by the netlist D10, and the additional information D11 may be used in a subsequent layout designing operation. For example, the additional information D11 may include information about at least one critical path included in the designed circuit. The critical path may denote a path of a signal for determining the performance of the circuit. For example, the critical path may denote a path which causes a maximum delay time dominating an operation speed of a digital circuit. When a pattern included in the critical path is formed in the integrated circuit IC, unlike a designed pattern, the performance of the integrated circuit IC may be reduced. Also, the additional information D11 may include information about signals requiring patterns having the same shape. For example, as described below with reference to FIGS. 6 and 7, the integrated circuit IC may include two or more regions, each region having identical circuits (e.g., the same circuits), and patterns having the same shape may be formed in each of the two or more regions of the integrated circuit IC so that signals corresponding to one another move through identical paths in the two or more regions. In a process of designing a layout of the integrated circuit IC, patterns having the same shape may be generated with reference to the additional information D11.

In operation S30, layout designing may be performed. For example, a layout of the integrated circuit IC may be designed based on the netlist D10 defining the circuit which is designed in operation S10, and data (i.e., layout data D30) defining the layout of the integrated circuit IC may be generated. The layout data D30 may include geometric information about patterns included in the integrated circuit IC. In some embodiments, the layout data D30 may have a GDSII format. In some embodiments, layout designing may be performed with a layout designing tool. As illustrated in FIG. 3, layout designing may be performed with reference to a result of a post-simulation which is performed in operation S40, and the post-simulation may simulate the integrated circuit IC on the basis of a layout of the integrated circuit IC. For example, the post-simulation may identify a parasitic component of a pattern that is byproduct of the layout. The layout of the integrated circuit IC may be corrected based on the post-simulation result. When layout designing, which satisfies target performance, is completed through the post-simulation, layout data D30 defining the layout may be generated as illustrated in FIG. 3.

As illustrated in FIG. 3, layout designing may be performed based on a design rule D20. The design rule D20 may define a plurality of rules based on a semiconductor process of manufacturing the integrated circuit IC. For example, the design rule D20 may define a pitch between patterns allowed in the same conductive layer and a space between the patterns. The layout of the integrated circuit IC may be designed to respect the plurality of rules defined in the design rule D20. For example, the integrated circuit IC may have a layout that is designed in accordance with the plurality of rules defined in the design rule D20

Operation S30 may include operations of a layout designing method according to exemplary embodiments. For example, operations of placing at least one signal pattern and placing at least one dummy pattern adjacent to the at least one signal pattern may be performed in operation S30, and thus, the signal pattern may have a shape predictable in the integrated circuit IC. Embodiments of operation S30 will be described below with reference to the drawings. In some embodiments, operation S30 may be performed by a computing system (e.g., computing system 100 of FIG. 13). The operations of placing the at least one signal pattern and placing the at least one dummy pattern may refer to the placing of the at least one signal patterns and at least one dummy patterns in the design layout.

In operation S50, optical proximity correction (OPC) may be performed. The OPC may denote a process of forming a pattern having a desired shape by correcting distortion such as refraction caused by a characteristic of light in photolithography included in a semiconductor process of manufacturing the integrated circuit IC, and a pattern on a mask may be determined by applying the OPC to the layout data D30. In some embodiments, the layout of the integrated circuit IC may be restrictively modified in operation S50, and a process of restrictively modifying the integrated circuit IC in operation S50 may be a post-processing process of optimizing a structure of the integrated circuit IC and may be referred to as a design polishing process.

In operation S70, an operation of manufacturing a mask may be performed. For example, since the OPC is applied to the layout data D30, patterns on the mask for forming a plurality of patterns may be defined, and at least one mask (e.g., a photomask) for forming patterns of each of a plurality of layers may be manufactured.

In operation S90, an operation of manufacturing the integrated circuit IC may be performed. For example, by patterning the plurality of layers with the at least one mask which is manufactured in operation S70, the integrated circuit IC may be manufactured. The operation of manufacturing the integrated circuit IC may include forming the integrated circuit IC based on the output of the operation S30 (e.g., the operation of layout designing). For example, the integrated circuit IC may be formed based on a design layout (e.g., layout data D30). As discussed more fully below, the design layout may comprise one or more signal patterns and one or more dummy patterns. Thus, the integrated circuit IC formed based on a design layout D30 may include one or more circuit signal patterns and one or more circuit dummy patterns that respectively correspond to the signal patterns and dummy patterns of the design layout.

As illustrated in FIG. 3, operation S90 may include operations S91 and S92.

In operation S91, a front-end-of-line (FEOL) process may be performed. The FEOL process may denote a process of forming individual elements (e.g., a transistor, a capacitor, a resistor, etc.) on a substrate in a process of manufacturing the integrated circuit IC. For example, the FEOL process may include a process of planarizing and cleaning a wafer, a process of forming a trench, a process of forming a well, a process of forming a gate line, and a process of forming a source and a drain.

In operation S92, a back-end-of-line (BEOL) process may be performed. The BEOL process may denote a process of connecting the individual elements (e.g., the transistor, the capacitor, the resistor, etc.) in the process of manufacturing the integrated circuit IC. For example, the BEOL process may include a process of silicidating a gate region, a source region, and a drain region, a process of adding a dielectric, a planarization process, a process of forming a hole, a process of adding a metal layer, a process of forming a via, and a process of forming a passivation layer. Subsequently, the integrated circuit IC may be packaged in a semiconductor package and may be used as a part of various applications. In some embodiments, the SA-LELE described above with reference to FIGS. 1 and 2 may be included in the BEOL process.

Figure 4:
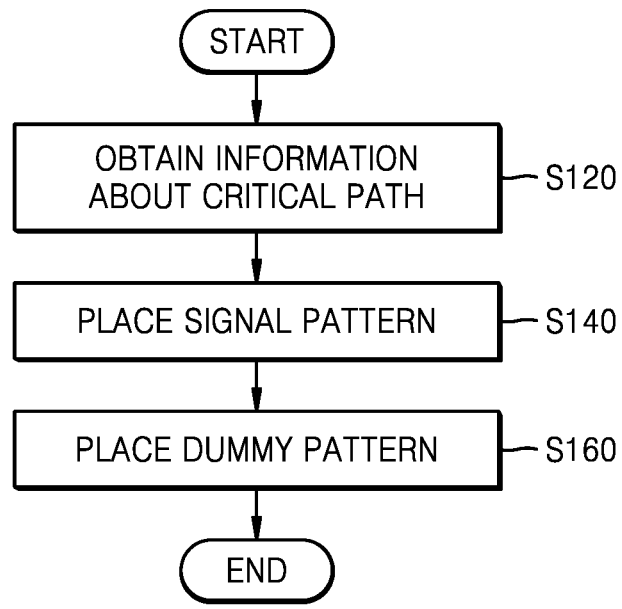
FIG. 4 is a flowchart illustrating a method of designing a layout of an integrated circuit, according to an exemplary embodiment.
Figure 5:
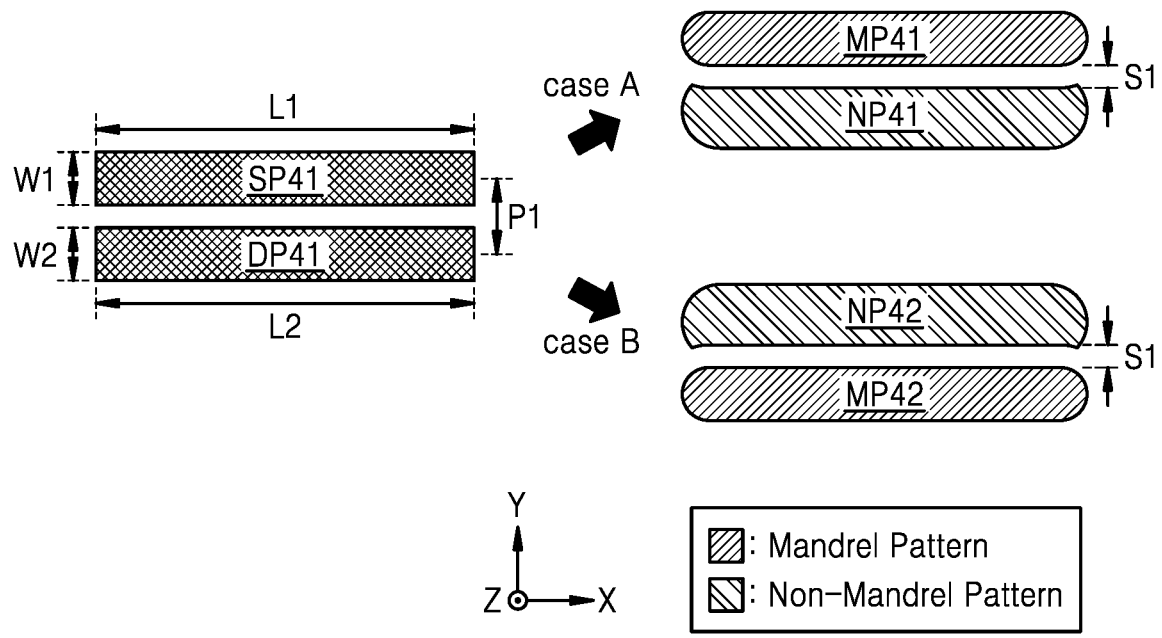
FIG. 5 is a diagram illustrating examples of patterns, according to an exemplary embodiment.

FIG. 4 is a flowchart illustrating a method of designing a layout of an integrated circuit, according to an exemplary embodiment, and FIG. 5 is a diagram illustrating examples of patterns according to an exemplary embodiment. In detail, FIG. 4 illustrates an operation included in operation S30 of FIG. 3, the left portion of FIG. 5 illustrates a designed layout of the integrated circuit, and the right portion of FIG. 5 illustrates patterns formed in the integrated circuit. The method of FIG. 4 may include operations S120, S140, and S160. In some embodiments, the method of FIG. 4 may be performed by a computing system (e.g., computing system 100 of FIG. 13). Hereinafter, FIGS. 4 and 5 will be described with reference to FIG. 3.

Referring to FIG. 4, an operation of obtaining information about a critical path may be performed in operation S120. As described above with reference to FIG. 3, the netlist D10 may include the additional information D11, and the information about the critical path included in the additional information D11 may be obtained. Information about a signal pattern included in the critical path may be obtained from the information about the critical path. Thus, the layout of the integrated circuit may be designed through subsequent operations so that a shape of a signal pattern included in the critical path among a plurality of patterns included in the integrated circuit is not deformed in a process of manufacturing the integrated circuit.

In operation S140, an operation of placing the signal pattern may be performed. The critical path may include at least one pattern formed in one or more conductive layers, and in operation S140, the signal pattern may denote a pattern included in the critical path. For example, as illustrated on the left portion of FIG. 5, a first signal pattern SP41 extending in an X-axis direction may be disposed, and the first signal pattern SP41 may have a first length L1 and a first width W1.

In operation S160, an operation of placing a dummy pattern may be performed. The dummy pattern may correspond to a signal undefined in a circuit (i.e., a signal undefined in the netlist D10 of FIG. 3). According to some embodiments, in the integrated circuit, the dummy pattern may be electrically floated. According to some embodiments, in the integrated circuit, a constant potential (e.g., a positive supply voltage, a negative supply voltage, or a ground voltage) may be applied to the dummy pattern. According to some embodiments, in the integrated circuit, a normal signal (e.g., a variable signal) may be applied to the dummy pattern. For example, as illustrated in FIG. 5, a first dummy pattern DP41 may extend in a direction (i.e., an X-axis direction) in which the first signal pattern DP41 extends and may have a second length L2 and a second width W2. Also, the first signal pattern SP41 and the first dummy pattern DP41 may be spaced apart from each other by a first pitch P1.

In some embodiments, a dummy pattern and a signal pattern may be spaced apart from each other by a pitch (e.g., a minimum pitch) between a mandrel pattern and a non-mandrel pattern. For example, in FIG. 5, the first pitch P1 may match a pitch between a mandrel pattern and a non-mandrel pattern. Therefore, the first signal pattern SP41 and a second dummy pattern DP41 may correspond to different patterns among mandrel patterns and non-mandrel patterns. For example, as in a case A of FIG. 5, when the first signal pattern SP41 is formed as a first mandrel pattern MP41, the first dummy pattern DP41 may be formed as a first non-mandrel pattern NP41. On the other hand, as in a case B of FIG. 5, when the first signal pattern SP41 is formed as a second non-mandrel pattern NP42, the first dummy pattern DP41 may be formed as a second mandrel pattern MP42. As illustrated on the right portion of FIG. 5, a first mandrel pattern MP41 (or a second mandrel pattern MP42) and a first non-mandrel pattern NP41 (or a second non-mandrel pattern NP42) may be spaced apart from each other by a distance corresponding to a first space S1. In some embodiments, the first space S1 may match a width (i.e., a length in a Y-axis direction) of a spacer. For example, the first space S1 may be a predetermined width that corresponds to the width of a spacer that will be formed by a deposition process on a side surface of a pattern formed by the mandrel when the integrated circuit is formed.

In some embodiments, a length of a dummy pattern may be equal to or greater than that of a signal pattern. For example, operation S160 of FIG. 4 may include an operation of determining a length of a dummy pattern so that the length of the dummy pattern is equal to or greater than that of a signal pattern. For example, in FIG. 5, the second length L2 of the first dummy pattern DP41 may be equal to or greater than the first length L1 of the first signal pattern SP41 (i.e., L2≥L1). Therefore, due to a dummy pattern, a signal pattern may maintain a certain width in the Y-axis direction across a total length in the X-axis direction. For example, as in the case A of FIG. 5, when the first signal pattern SP41 is formed as the first mandrel pattern MP41, the first signal pattern SP41 may not be affected by the first non-mandrel pattern NP41, and as in the case B of FIG. 5, even when the first signal pattern SP41 is formed as the second non-mandrel pattern NP42, a spacer for the second mandrel pattern MP42 may uniformly affect the second non-mandrel pattern NP42. Accordingly, a problem where a signal pattern is formed as a non-mandrel pattern and is deformed in a process of designing the layout of the integrated circuit may be solved.

In some embodiments, a width of a dummy pattern may be determined based on a width of a signal pattern and a pitch of the signal pattern. For example, operation S160 of FIG. 4 may include an operation of determining a width of a dummy pattern, based on a width of a signal pattern and a pitch of the signal pattern. For example, the second width W2 of the first dummy pattern DP41 may be determined so that the first mandrel pattern MP41 and the second non-mandrel pattern NP42 each corresponding to the first signal pattern SP41 have the same width (i.e., a length in the Y-axis direction). As described above with reference to FIGS. 1 and 2, in the case A, the first mandrel pattern MP41 may have a designed width (i.e., the first width W1), and in the case B, the second non-mandrel pattern NP42 may be affected by the second mandrel pattern MP42 adjacent thereto. Accordingly, the second width W2 of the second dummy pattern DP41 may be determined based on the first pitch P1 and the width of the first signal pattern SP41 so that a reduced width of the second non-mandrel pattern NP42 in the case B matches the first mandrel pattern MP41 of the case A.

Figure 6:
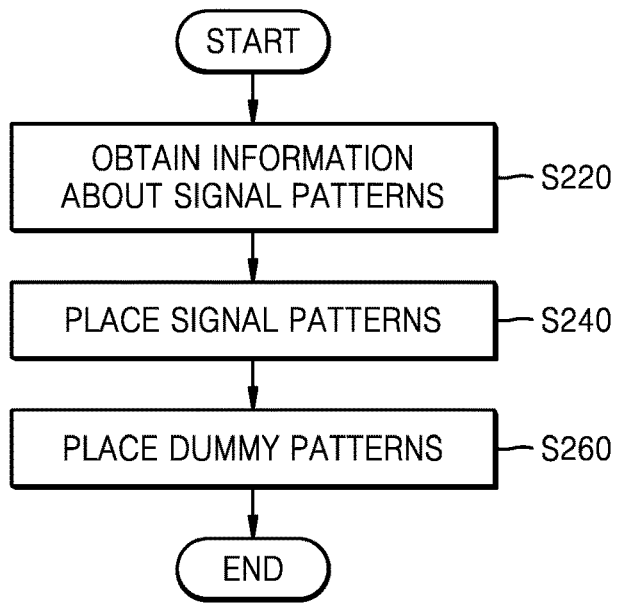
FIG. 6 is a flowchart illustrating a method of designing a layout of an integrated circuit, according to an exemplary embodiment.
Figure 7:
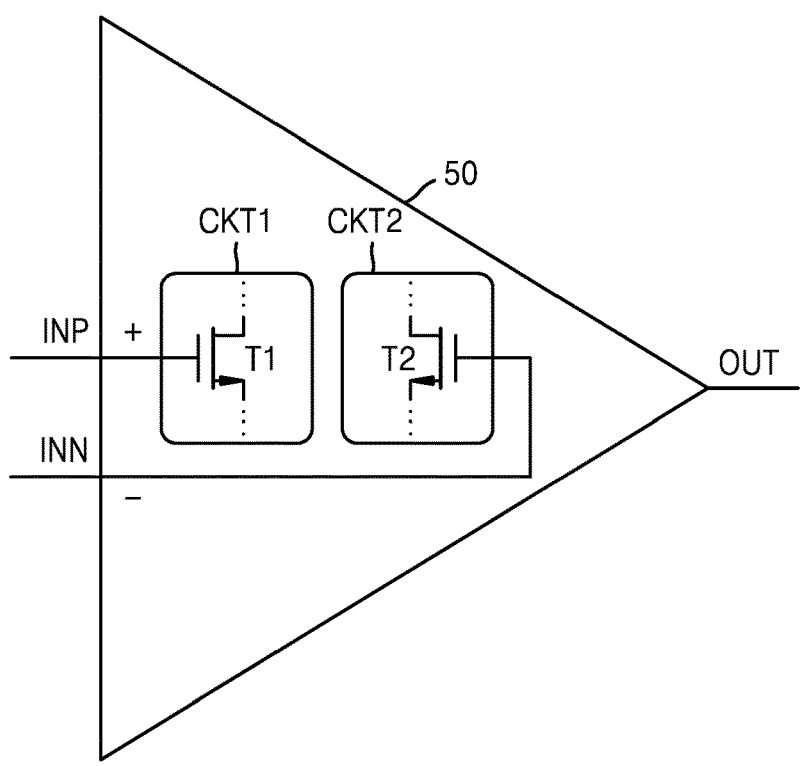
FIG. 7 is a circuit diagram illustrating an example of a circuit included in an integrated circuit, according to an exemplary embodiment.

FIG. 6 is a flowchart illustrating a method of designing a layout of an integrated circuit, according to an exemplary embodiment, and FIG. 7 is a circuit diagram illustrating an example of a circuit included in the integrated circuit, according to an exemplary embodiment. In detail, FIG. 6 illustrates an operation included in operation S30 of FIG. 3, and FIG. 7 illustrates an operational amplifier 50 as an example of a circuit using signals requiring patterns having the same shape. The method of FIG. 6 may include operations S220, S240, and S260. In some embodiments, the method of FIG. 6 may be performed by a computing system (e.g., computing system 100 of FIG. 13). Hereinafter, FIGS. 6 and 7 will be described with reference to FIG. 3.

Referring to FIG. 6, an operation of obtaining information about signal patterns requiring the same shape may be performed in operation S220. As described above with reference to FIG. 3, the netlist D10 may include the additional information D11, and information about signals requiring patterns having the same shape included in the additional information D11 may be obtained. For example, as illustrated in FIG. 7, the integrated circuit may include the operational amplifier 50 which receives a non-inverting input signal INP and an inverting input signal INN to generate an output signal OUT. An input stage of the operational amplifier 50 may include a first circuit CKT1 and a second circuit CKT2, each of which have the same structure, and respectively correspond to the non-inverting input signal INP and the inverting input signal INN. As illustrated in FIG. 7, the non-inverting input signal INP may be applied to a gate of a first transistor T1 included in the first circuit CKT1, and the inverting input signal INN may be applied to a gate of a second transistor T2 included in the second circuit CKT2.

The non-inverting input signal INP and the inverting input signal INN may correspond to each other in the first circuit CKT1 and the second circuit CKT2, and in the integrated circuit, patterns for the non-inverting input signal INP and patterns for the inverting input signal INN may have the same shape. Similarly, patterns for internal signals of the first circuit CKT1 and patterns for internal signals of the second circuit CKT2 corresponding thereto may have the same shapes. The operational amplifier 50 of FIG. 7 is merely an example of a circuit using signals requiring patterns having the same shape, and the integrated circuit may include various circuits using signals having such a relationship. For example, as in a differential signal of a differential circuit, complementary signals may need patterns having the same shape.

Referring again to FIG. 6, information about signal patterns requiring the same shape may be obtained from information about signals requiring patterns having the same shape included in the additional information D11, and thus, a layout of the integrated circuit may be designed through subsequent operations so that shapes of signal patterns requiring the same shape among a plurality of patterns included in the integrated circuit are not deformed in a process of manufacturing the integrated circuit.

In operation S240, an operation of placing the signal patterns may be performed. For example, as described below with reference to FIGS. 8A and 8B, signal patterns requiring the same shape may be disposed to have the same length and width and to extend in parallel. In some embodiments, as described below with reference to FIG. 9, signal patterns may be disposed adjacent to one another.

In operation S260, an operation of placing dummy patterns may be performed. The dummy patterns may be disposed adjacent to the signal patterns which are placed in operation S240, and thus, as described above with reference to FIG. 5, the signal patterns may maintain a certain width. In some embodiments, as described below with reference to FIGS. 8A and 8B, two dummy patterns may be disposed on both sides of one signal pattern. Also, in some embodiments, as described below with reference to FIG. 9, the signal patterns may be disposed adjacent to one another, and a dummy pattern may be disposed opposite to an adjacent signal pattern.

Figure 8A:
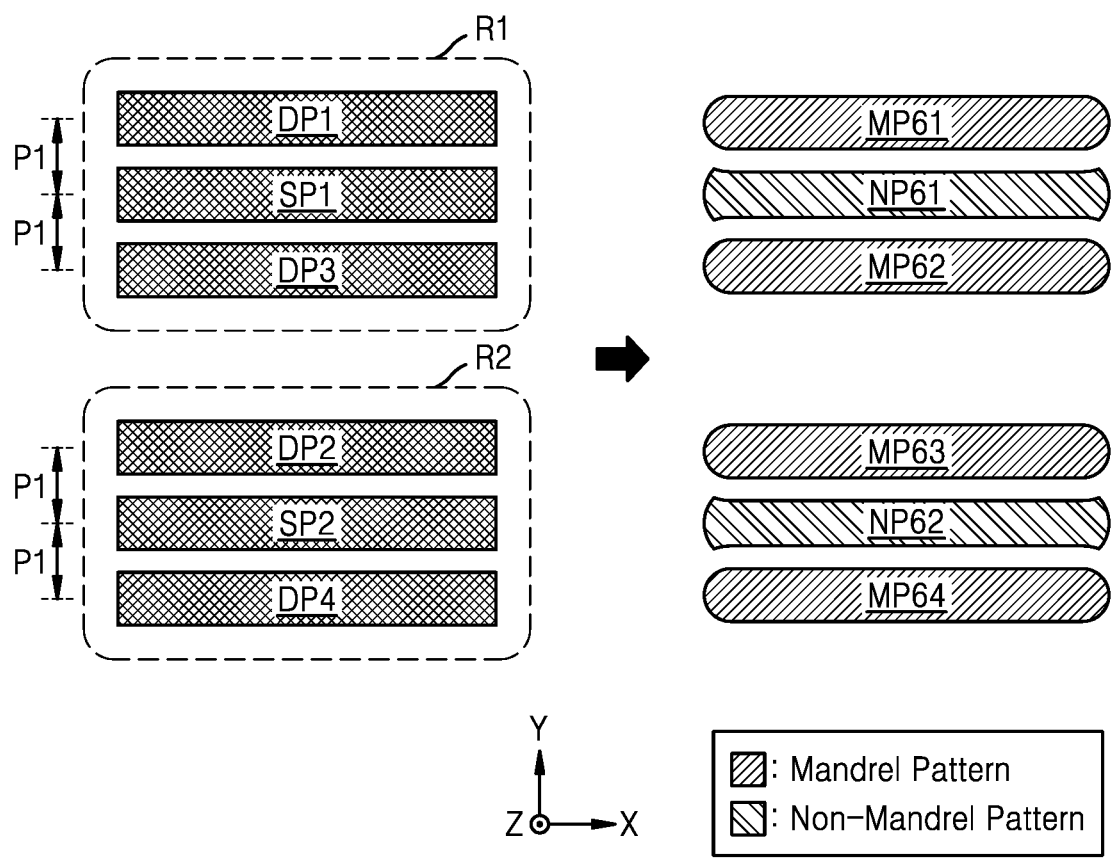
FIGS. 8A and 8B are diagrams illustrating examples of patterns, according to exemplary embodiments.
Figure 8B:
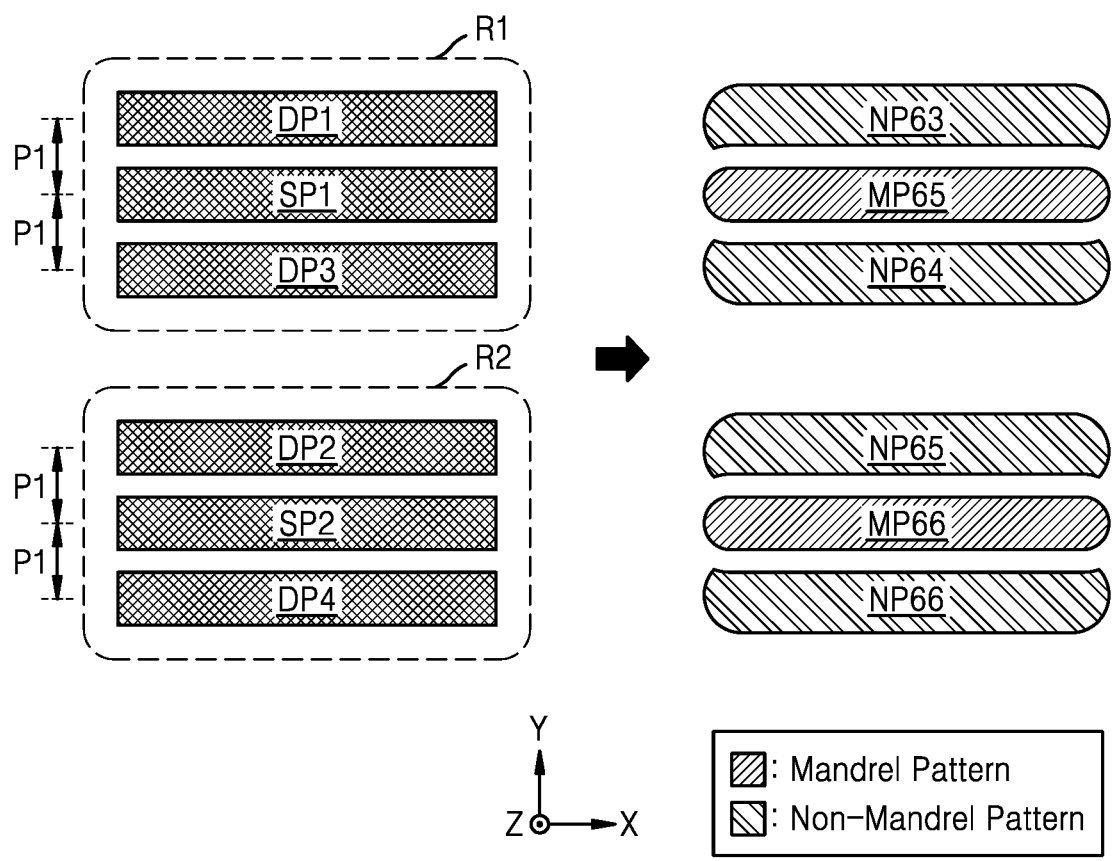

FIGS. 8A and 8B are diagrams illustrating examples of patterns according to exemplary embodiments. In detail, the left portion of each of FIGS. 8A and 8B illustrates a designed layout of an integrated circuit, and the right portion of each of FIGS. 8A and 8B illustrates patterns formed in the integrated circuit. In some embodiments, the layout illustrated on the left portion of each of FIGS. 8A and 8B may be designed by the method of designing the layout of the integrated circuit described above with reference to FIG. 6. Hereinafter, repetitive descriptions will be omitted in describing FIGS. 8A and 8B.

In some embodiments, the integrated circuit may include two or more regions, each corresponding to the same circuit. For example, as illustrated in FIG. 8A, the layout of the integrated circuit may include a first region R1 corresponding to a first circuit and a second region R2 corresponding to a second circuit which is the same as the first circuit. In the first region R1 and the second region R2, signal patterns (e.g., a first signal pattern SP1 and a second signal pattern SP2) for signals corresponding to each other may need the same shape.

In some embodiments, two dummy patterns may be disposed with one on each side of each signal pattern requiring the same shape. For example, as illustrated in FIGS. 8A and 8B, a first dummy pattern DP1 and a third dummy pattern DP3 may be disposed on respective sides of a first signal pattern SP1 extending in an X-axis direction so as to be adjacent to the first signal pattern SP1, and a second dummy pattern DP2 and a fourth dummy pattern DP4 may be disposed on respective sides of a second signal pattern SP2 extending in the X-axis direction so as to be adjacent to the second signal pattern SP2. Therefore, despite a process of manufacturing the integrated circuit, the first signal pattern SP1 and the second signal pattern SP2 may have the same shape. In detail, in a case where identically designed layouts are provided, FIG. 8A illustrates an example where the first signal pattern SP1 and the second signal pattern SP2 are formed as non-mandrel patterns, and FIG. 8B illustrates an example where the first signal pattern SP1 and the second signal pattern SP2 are formed as mandrel patterns. As described below, the first signal pattern SP1 and the second signal pattern SP2 may be formed as patterns having the same shape regardless of the fact that the first signal pattern SP1 and the second signal pattern SP2 are formed as non-mandrel patterns or mandrel patterns. In some embodiments, the first dummy pattern DP1 and the third dummy pattern DP3 may each have a length (i.e., a length in the X-axis direction) which is equal to or greater than a length of the first signal pattern SP1.

Referring to FIG. 8A, when the first signal pattern SP1 is formed as a first non-mandrel pattern NP61, the first dummy pattern DP1 and the third dummy pattern DP3, each adjacent to the first signal pattern SP1, may be respectively formed as a first mandrel pattern MP61 and a second mandrel pattern MP62. Therefore, the first non-mandrel pattern NP61 may have a constant width which is reduced in the center portion at both sides thereof, based on the first mandrel pattern MP61 and the second mandrel pattern MP62. For example, the width (i.e., a length in a Y-axis direction) of the first non-mandrel pattern NP61 may be constant in the center portion, and then may become wider at the end portions. Similarly, when the second signal pattern SP2 is formed as a second non-mandrel pattern NP62, the second dummy pattern DP2 and the fourth dummy pattern DP4, each adjacent to the second signal pattern SP2, may be respectively formed as a third mandrel pattern MP63 and a fourth mandrel pattern MP64. Therefore, as illustrated in FIG. 8A, the second non-mandrel pattern NP62 may have a constant width which is reduced in the center portion at both sides thereof. For example, the width (i.e., a length in a Y-axis direction) of the second non-mandrel pattern NP62 may be constant in the center portion, and then may become wider at the end portions. Therefore, the first non-mandrel pattern NP61 and the second non-mandrel pattern NP62, respectively corresponding to the first signal pattern SP1 and the second signal pattern SP2, may have the same shape.

Referring to FIG. 8B, when the first signal pattern SP1 is formed as a fifth mandrel pattern MP65, the first dummy pattern DP1 and the third dummy pattern DP3, each adjacent to the first signal pattern SP1, may be respectively formed as a third non-mandrel pattern NP63 and a fourth non-mandrel pattern NP64, and the fifth mandrel pattern MP65 may not be affected by the third non-mandrel pattern NP63 and the fourth non-mandrel pattern NP64. Similarly, when the second signal pattern SP2 is formed as a sixth mandrel pattern MP66, the second dummy pattern DP2 and the fourth dummy pattern DP4 each adjacent to the second signal pattern SP2 may be respectively formed as a fifth non-mandrel pattern NP65 and a sixth non-mandrel pattern NP66, and the sixth mandrel pattern MP66 may not be affected by the fifth non-mandrel pattern NP65 and the sixth non-mandrel pattern NP66. Therefore, the first non-mandrel pattern NP61 and the second non-mandrel pattern NP62, respectively corresponding to the first signal pattern SP1 and the second signal pattern SP2, may have the same shape.

Figure 9:
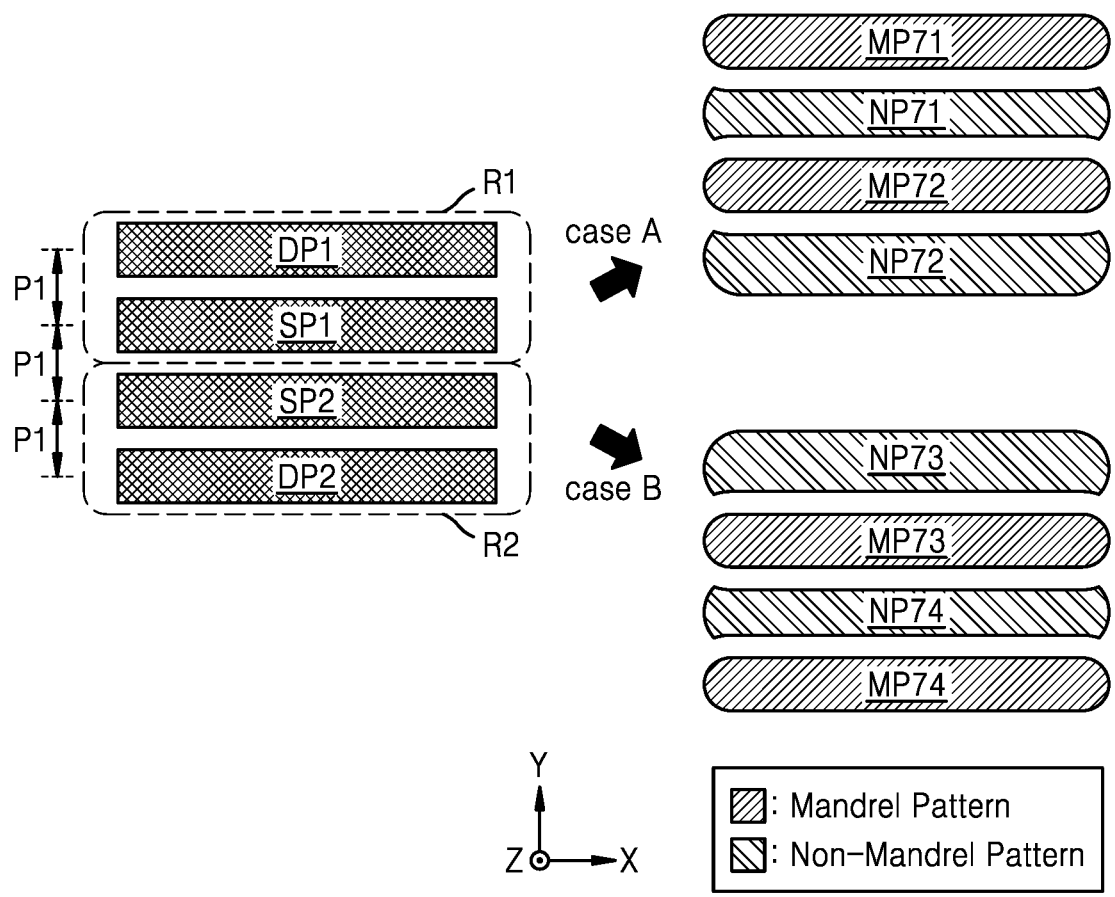
FIG. 9 is a diagram illustrating examples of patterns, according to an exemplary embodiment.

FIG. 9 is a diagram illustrating examples of patterns according to an exemplary embodiment. In detail, the left portion of FIG. 9 illustrates a designed layout of an integrated circuit, and the right portion of FIG. 9 illustrates patterns formed in the integrated circuit. In some embodiments, the layout illustrated on the left portion of FIG. 9 may be designed by the method of designing the layout of the integrated circuit described above with reference to FIG. 6. Hereinafter, descriptions given above with reference to FIGS. 8A and 8B will be omitted in describing FIG. 9.

Referring to FIG. 9, a first region R1 and a second region R2 may correspond to the same circuit, and a first signal pattern SP1 included in the first region R1 and a second signal pattern SP2 included in the second region R2 may be formed in the same shape. The first signal pattern SP1 and the second signal pattern SP2 may extend in parallel in an X-axis direction.

In some embodiments, signals requiring the same shape may be disposed adjacent to each other and may be disposed between dummy patterns. For example, as illustrated in FIG. 9, the first signal pattern SP1 and the second signal pattern SP2 may be disposed adjacent to each other, a first dummy pattern DP1 may be disposed adjacent to the first signal pattern SP1, and a second dummy pattern DP2 may be disposed adjacent to the second signal pattern SP2. The first signal pattern SP1 and the second signal pattern SP2 may have the same length (i.e., a length in the X-axis direction). In some embodiments, each of the first dummy pattern DP1 and the second dummy pattern DP2 may have a length which is equal to or greater than a length of the first signal pattern SP1 (or the second signal pattern SP2).

As illustrated in the left portion of FIG. 9, when the first dummy pattern DP1, the first signal pattern SP1, the second signal pattern SP2, and the second dummy pattern DP2 are sequentially disposed, the first signal pattern SP1 and the second signal pattern SP2 may be independently formed as a mandrel pattern and a non-mandrel pattern to have the same shape. For example, as in a case A of FIG. 9, when the first signal pattern SP1 and the second signal pattern SP2 are respectively formed as a first non-mandrel pattern NP71 and a second mandrel pattern MP72, the first dummy pattern DP1 and the second dummy pattern DP2 may be respectively formed as a first mandrel pattern MP71 and a second non-mandrel pattern NP72. Due to adjacent mandrel patterns (i.e., the first mandrel pattern MP71 and the second mandrel pattern MP72), the first non-mandrel pattern NP71 corresponding to the first signal pattern SP1 may have a constant width which is reduced in the center portion at both sides thereof. For example, the width (i.e., a length in a Y-axis direction) of the first non-mandrel pattern NP71 may be constant in the center portion, and then may become wider at the end portions. Also, the second mandrel pattern MP72 corresponding to the second signal pattern SP2 may not be affected by adjacent non-mandrel patterns (i.e., the first non-mandrel pattern NP71 and the second non-mandrel pattern NP72).

On the other hand, as in a case B of FIG. 9, when the first signal pattern SP1 and the second signal pattern SP2 are respectively formed as a third mandrel pattern MP73 and a fourth non-mandrel pattern NP74, the first dummy pattern DP1 and the second dummy pattern DP2 may be respectively formed as a third non-mandrel pattern NP73 and a fourth mandrel pattern MP74. The third mandrel pattern MP73 corresponding to the first signal pattern SP1 may not be affected by adjacent non-mandrel patterns (i.e., the third non-mandrel pattern NP73 and the fourth non-mandrel pattern NP74). Also, due to adjacent mandrel patterns (i.e., the third mandrel pattern MP73 and the fourth mandrel pattern MP74), the fourth non-mandrel pattern NP74 corresponding to the second signal pattern SP2 may have a constant width which is reduced in the center portion at both sides thereof. For example, the width (i.e., a length in a Y-axis direction) of the fourth non-mandrel pattern NP74 may be constant in the center portion, and then may become wider at the end portions.

Figure 10A:
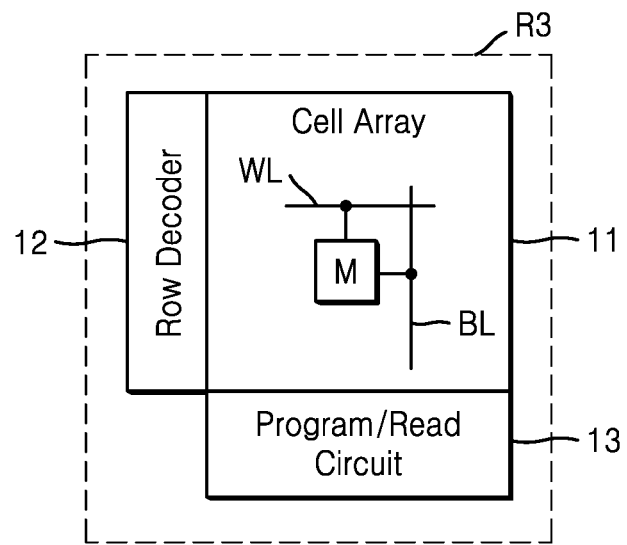
FIGS. 10A and 10B are diagrams illustrating a portion of an integrated circuit, according to an exemplary embodiment.
Figure 10B:
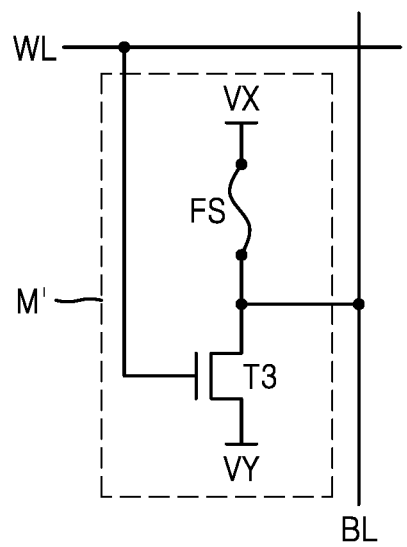

FIGS. 10A and 10B are diagrams illustrating a portion of an integrated circuit according to an exemplary embodiment. In detail, FIG. 10A is a block diagram illustrating a one-time programmable (OTP) region R3 included in the integrated circuit, and FIG. 10B is a circuit diagram illustrating an example of a memory cell M included in the OTP region R3.

In some embodiments, the integrated circuit may include the OTP region R3. For example, the integrated circuit may include the first region R1, the second region R2, and the OTP region R3. As illustrated in FIG. 10A, the OTP region R3 may include a cell array 11, a row decoder 12, and a program/read circuit 13. The cell array 11 may include a plurality of memory cells (e.g., M), and the memory cell M may be connected to a word line WL and a bit line BL and may be irreversibly programmed. The row decoder 12 may select memory cells connected to one word line (e.g., WL) among the plurality of memory cells. The program/read circuit 13 may perform an operation of programming or reading the memory cells selected by the row decoder 12.

Referring to FIG. 10B, as an example of the memory cell M of FIG. 10A, a memory cell M' of FIG. 10B may be a fuse-type OTP cell. As illustrated in FIG. 10B, the memory cell M' may be connected to a word line WL and a bit line BL, and may include a fuse FS and a transistor T3. The fuse FS may denote an arbitrary element which, when a high voltage is applied to both ends thereof or a high current flows therethrough, is fused (e.g., the both ends are opened or are put in a high resistance state). For example, when a low voltage (e.g., a ground voltage) is applied to the bit line BL and a voltage VX increases, the fuse FS may be opened or may have a high resistance state. In order to read data stored in the memory cell M', when the word line WL is activated (i.e., a high-level voltage is applied to the word line WL), a voltage of the bit line BL or a current output through the bit line BL may be determined based on the voltage VX and a state and a voltage VY of the fuse FS, and thus, by detecting the voltage and/or a current of the bit line BL, the data stored in the memory cell M' (i.e., the state of the fuse FS) may be determined. Examples where the fuse FS is formed by using a pair of dummy patterns in the integrated circuit will be described below with reference to FIGS. 11 and 12.

Figure 11:
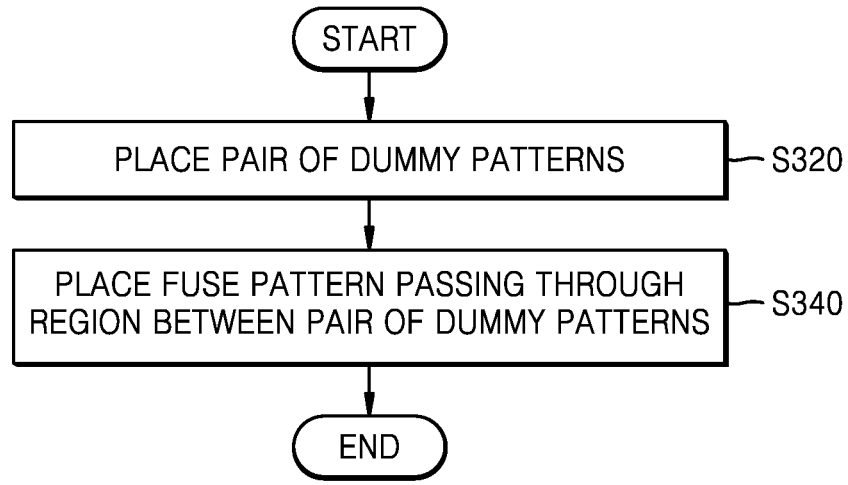
FIG. 11 is a flowchart illustrating a method of designing a layout of an integrated circuit, according to an exemplary embodiment.
Figure 12:
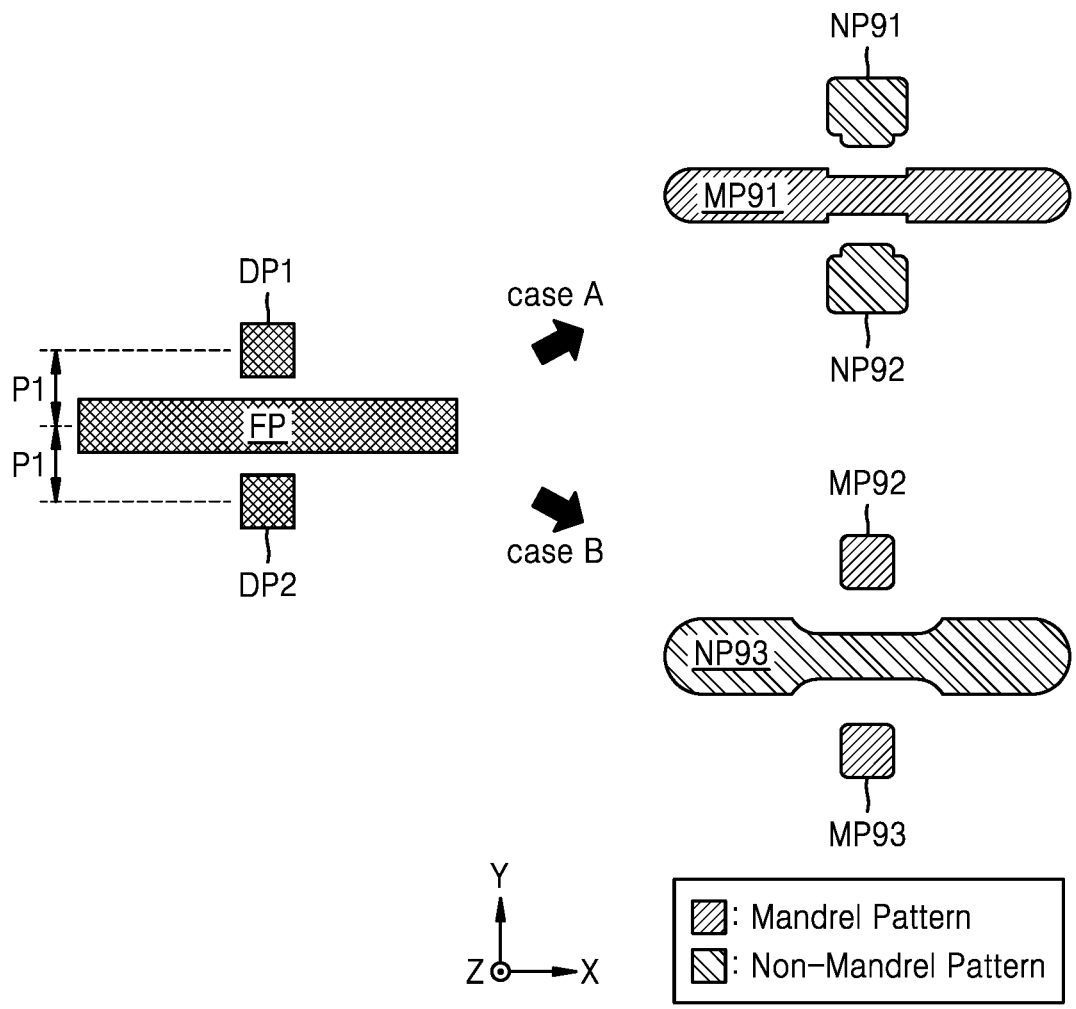
FIG. 12 is a diagram illustrating examples of patterns, according to an exemplary embodiment.

FIG. 11 is a flowchart illustrating a method of designing a layout of an integrated circuit, according to an exemplary embodiment, and FIG. 12 is a diagram illustrating examples of patterns according to an exemplary embodiment. In detail, FIG. 12 illustrates an operation included in operation S30 of FIG. 3, the left portion of FIG. 12 illustrates a designed layout of the integrated circuit, and the right portion of FIG. 12 illustrates patterns formed in the integrated circuit. The method of FIG. 11 may include operations S320 and S340. In some embodiments, the method of FIG. 11 may be performed by a computing system (e.g., 100 of FIG. 13).

Referring to FIG. 11, an operation of placing a pair of dummy patterns may be performed in operation S320. For example, as illustrated in FIG. 12, the pair of dummy patterns including a first dummy pattern DP1 and a second dummy pattern DP2 may be disposed. In some embodiments, as illustrated in FIG. 12, the first dummy pattern DP1 and the second dummy pattern DP2 may be spaced apart from each other by a pitch (i.e., 2*P1) which is two times a pitch (e.g., a minimum pitch) of a mandrel pitch and a non-mandrel pitch, namely, a first pitch P1. Therefore, as illustrated on the right portion of FIG. 12, both the first dummy pattern DP1 and the second dummy pattern DP2 may be formed as non-mandrel patterns or mandrel patterns.

In operation S340, an operation of placing a fuse pattern FP passing through a region between the pair of dummy patterns may be performed. The fuse pattern FP, as described above with reference to FIG. 10B, may denote a pattern which, when a strong electrical signal is applied thereto, is opened or is transited to a high resistance state. Since the fuse pattern passes through the region between the pair of dummy patterns, a portion (e.g., a portion corresponding to the region between the pair of dummy patterns) of the fuse pattern may have a reduced width. For example, as illustrated on the left portion of FIG. 12, the pair of dummy patterns (i.e., the first dummy pattern DP1 and the second dummy pattern DP2) opposite to each other in a Y-axis direction may be disposed, and the fuse pattern FP may pass through the first dummy pattern DP1 and the second dummy pattern DP2 and may extend in an X-axis direction. As illustrated in FIG. 12, the first dummy pattern DP1 and the second dummy pattern DP2 may be spaced apart from each other by a pitch which is two times the first pitch P1, and thus, the fuse pattern FP may be spaced apart from each of the first dummy pattern DP1 and the second dummy pattern DP2 by the first pitch P1. A length (i.e., a length in the X-axis direction) of each of the first dummy pattern DP1 and the second dummy pattern DP2 may be less than that of the fuse pattern FP and may be determined based on a fusing characteristic of the fuse pattern FP (e.g., a length requiring a reduced width of the fuse pattern FP).

As in a case A of FIG. 12, when the fuse pattern FP is formed as a mandrel pattern MP91, the first dummy pattern DP1 and the second dummy pattern DP2 may be respectively formed as a first non-mandrel pattern NP91 and a second non-mandrel pattern NP92. As illustrated in FIG. 12, a portion of the mandrel pattern MP91 may have a width which is reduced compared to another portion between the first non-mandrel pattern NP91 and the second non-mandrel pattern NP92. For example, as described above with reference to FIG. 3, when designing of a layout of the integrated circuit is completed, OPC may be performed, and in order to ensure insulation of the mandrel pattern MP91 from the first non-mandrel pattern NP91 and the second non-mandrel pattern NP92, as illustrated in FIG. 12, a shape of each of the first non-mandrel pattern NP91 and the second non-mandrel pattern NP92 may be changed, and the mandrel pattern MP91 may include a portion having a reduced width. Therefore, when a strong electrical signal is applied to the mandrel pattern MP91, disconnection or a high resistance state may occur in the portion of the mandrel pattern MP91 that has the reduced width.

As in a case B of FIG. 12, when the fuse pattern FP is formed as a third non-mandrel pattern NP93, the first dummy pattern DP1 and the second dummy pattern DP2 may be respectively formed as a second mandrel pattern MP92 and a third mandrel pattern MP93. As illustrated in FIG. 12, due to the second mandrel pattern MP92 and the third mandrel pattern MP93, a portion of the third non-mandrel pattern NP93 may have a width which is reduced compared to another portion between the second mandrel pattern MP92 and the third mandrel pattern MP93. For example, as described above with reference to FIGS. 1 and 2, due to spacers used to form the second mandrel pattern MP92 and the third mandrel pattern MP93, the third non-mandrel pattern NP93 may include a portion corresponding to a reduced width. Therefore, when a strong electrical signal is applied to the third non-mandrel pattern NP93, disconnection or a high resistance state may occur in the portion, which has the reduced width, of the third non-mandrel pattern NP93.

Figure 13:
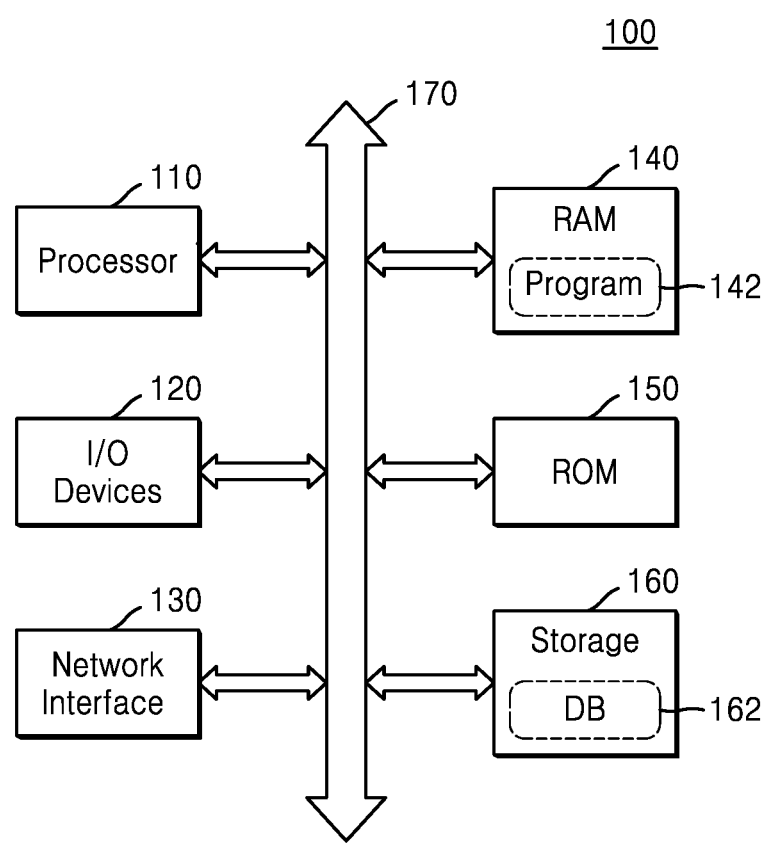
FIG. 13 is a block diagram illustrating a computing system including a memory storing a program, according to an exemplary embodiment.

FIG. 13 is a block diagram illustrating a computing system 100 including a memory storing a program, according to an exemplary embodiment. At least some of operations included in a method (e.g., the method of FIG. 3) of manufacturing an integrated circuit, according to exemplary embodiments, may be performed by the computing system 100. In some embodiments, a method (e.g., operation S30 of FIG. 3) of designing a layout of an integrated circuit may be performed by the computing system 100 of FIG. 13.

The computing system 100 may be a stationary computing system, such as, for example, desktop computers, workstations, and servers, or may be a portable computing system, such as, for example, laptop computers. As illustrated in FIG. 13, the computing system 100 may include a processor 110, a plurality of input/output (I/O) devices 120, a network interface 130, random access memory (RAM) 140, read-only memory (ROM) 150, and a storage device 160. The processor 110 may be connected to the processor 110, the I/O devices 120, the network interface 130, the RAM 140, the ROM 150, and the storage device 160, and the elements may communicate with one another through a bus 170.

The processor 110 may be referred to as a processing unit, and for example, may include at least one core for executing an arbitrary instruction set (e.g., Intel Architecture-32 (IA-32), 64-bit extension IA-32, x86-64, PowerPC, Sparc, MIPS, ARM, IA-64, etc.) like micro-processors, application processors (APs), digital signal processors (DSPs), and graphic processing units (GPUs). For example, the processor 110 may access a memory (i.e., the RAM 140 or the ROM 150) through the bus 170 and may execute instructions stored in the RAM 140 or the ROM 150.

The RAM 140 may store the program 142 for designing a layout of an integrated circuit according to an exemplary embodiment or may store at least a portion of the program 142, and the program 142 may allow the processor 110 to perform a method (e.g., operation S30 of FIG. 3) of manufacturing an integrated circuit. For example, the program 142 may include a series of instructions executable by the processor 110, and the series of instructions included in the program 142 may allow the processor 110 to perform, for example, at least some of operations included in the flowcharts described above with reference to FIGS. 4, 6, and 11.

Even when power supplied to the computing system 100 is cut off, data stored in the storage device 160 may not be erased. For example, the storage device 160 may include a non-volatile memory device and/or may include a storage medium such as magnetic tape, an optical disk, or a magnetic disk. Also, the storage device 160 may be detachably attached to the computing system 100. The storage device 160 may store the program 142 according to an exemplary embodiment, and before the program 142 is executed by the processor 110, the program 142 or at least a portion thereof may be loaded from the storage device 160 into the RAM 140. In some embodiments, the storage device 160 may store a file written into a program language, and the program 142 generated from the file by a compiler or at least a portion thereof may be loaded into the RAM 140. Also, as illustrated in FIG. 13, the storage device 160 may store a database (DB) 162, and the DB 162 may include information (e.g., the design rule D20 of FIG. 3) needed for designing a layout of an integrated circuit.

The storage device 160 may store data which is to be processed by the processor 110 or data obtained through processing by the processor 110. For example, the processor 110 may process data stored in the storage device 160 to generate data, based on the program 142, and may store the generated data in the storage device 160. For example, the storage device 160 may store the netlist D10 and the layout data D30 of FIG. 3.

The I/O devices 120 may include input devices such as a keyboard and a pointing device and may include output devices such as a display and a printer. For example, by using the I/O devices 120, a designer may trigger execution of the program 142 by the processor 110, input the netlist D10 of FIG. 3, or check the layout data D30 of FIG. 3.

The network interface 130 may provide access to an external network outside the computing system 100. For example, the network may include a plurality of computing systems and communication links, and the communication links may include wired links, optical links, wireless links, or other arbitrary types of links.

While the inventive concept has been particularly shown and described with reference to embodiments thereof, it will be understood that various changes in form and details may be made therein without departing from the spirit and scope of the following claims.

What is claimed is:

1. An integrated circuit comprising:
a first region corresponding to a first circuit and comprising a first dummy pattern and a first signal pattern which are spaced apart from each other by a predetermined width in a conductive layer and extend in parallel in a first horizontal direction; and
a second region corresponding to a second circuit which is identical to the first circuit and comprising a second dummy pattern and a second signal pattern which are spaced apart from each other by the predetermined width in the conductive layer and extend in parallel in the first horizontal direction,
wherein the first signal pattern and the second signal pattern are configured so that a first signal and a second signal corresponding to each other in the first circuit and the second circuit are respectively applied to the first signal pattern and the second signal pattern,
wherein at least one of the first dummy pattern, the second dummy pattern, the first signal pattern, and the second signal pattern corresponds to a mandrel pattern,
wherein at least one of the first dummy pattern, the second dummy pattern, the first signal pattern, and the second signal pattern corresponds to a non-mandrel pattern, and
wherein the predetermined width corresponds to a width of a single spacer formed on the mandrel pattern.

2. The integrated circuit of claim 1,
wherein each of the first dummy pattern and the second dummy pattern is configured to be electrically floated, or
wherein each of the first dummy pattern and the second dummy pattern is configured so that a constant potential or a normal signal is applied thereto.

3. The integrated circuit of claim 1,
wherein each of the first signal pattern and the second signal pattern has a first length in the first horizontal direction, and
wherein each of the first dummy pattern and the second dummy pattern has a second length equal to or greater than the first length in the first horizontal direction.

4. The integrated circuit of claim 1,
wherein the first region further comprises a third dummy pattern spaced apart from the first signal pattern by the predetermined width in the conductive layer and extending in parallel in the first horizontal direction, and
wherein the second region further comprises a fourth dummy pattern spaced apart from the second signal pattern by the predetermined width in the conductive layer and extending in parallel in the first horizontal direction.

5. The integrated circuit of claim 4, wherein either:
each of the first dummy pattern, the second dummy pattern, the third dummy pattern, and the fourth dummy pattern corresponds to the mandrel pattern, and each of the first signal pattern and the second signal pattern corresponds to the non-mandrel pattern, or
each of the first dummy pattern, the second dummy pattern, the third dummy pattern, and the fourth dummy pattern corresponds to the non-mandrel pattern, and each of the first signal pattern and the second signal pattern corresponds to the mandrel pattern.

6. The integrated circuit of claim 1, wherein the first dummy pattern, the first signal pattern, the second signal pattern, and the second dummy pattern are sequentially aligned in a second horizontal direction perpendicular to the first horizontal direction.

7. The integrated circuit of claim 6, wherein either:
each of the first dummy pattern and the second signal pattern corresponds to the mandrel pattern, and each of the first signal pattern and the second dummy pattern corresponds to the non-mandrel pattern, or
each of the first dummy pattern and the second signal pattern corresponds to the non-mandrel pattern, and each of the first signal pattern and the second dummy pattern corresponds to the mandrel pattern.

8. The integrated circuit of claim 1, wherein the first signal is a complementary signal of the second signal.

9. The integrated circuit of claim 1, further comprising:
a one time programmable (OTP) region comprising a fuse,
wherein the fuse comprises:
a pair of dummy patterns spaced apart from each other in the conductive layer; and
a fuse pattern configured to be fused between the pair of dummy patterns, the fuse extending by passing through a region between the pair of dummy patterns, and
wherein either:
the pair of dummy patterns correspond to the mandrel patterns, and the fuse pattern corresponds to the non-mandrel pattern, or
the pair of dummy patterns correspond to the non-mandrel patterns, and the fuse pattern corresponds to the mandrel pattern.

10. A method of manufacturing an integrated circuit, the method comprising:
obtaining information about a first signal pattern and a second signal pattern having the same shape in a conductive layer;
placing in the conductive layer of a design layout the first signal pattern and the second signal pattern each extending in a first horizontal direction;
after placing the first signal pattern and the second signal pattern in the design layout, placing in the conductive layer of the design layout a first dummy pattern which is spaced apart from the first signal pattern by a first pitch and extends in the first horizontal direction;
after placing the first dummy pattern in the design layout, placing in the conductive layer of the design layout a second dummy pattern which is spaced apart from the second signal pattern by the first pitch and extends in the first horizontal direction; and
forming the integrated circuit based on the design layout, the integrated circuit comprising first and second signal patterns that correspond to the first and second signal patterns of the design layout and first and second dummy patterns that correspond to the first and second dummy patterns of the design layout,
wherein the first pitch corresponds to a pitch between a mandrel pattern and a non-mandrel pattern.

11. The method of claim 10,
wherein each of the first dummy pattern and the second dummy pattern of the integrated circuit is configured to be electrically floated, or
wherein each of the first dummy pattern and the second dummy pattern of the integrated circuit is configured so that a constant potential or a normal signal is applied thereto.

12. The method of claim 10,
wherein each of the first signal pattern and the second signal pattern has a first length in the first horizontal direction, and
wherein each of the first dummy pattern and the second dummy pattern has a second length equal to or greater than the first length in the first horizontal direction.

13. The method of claim 10, further comprising:
placing a third dummy pattern which is spaced apart from the first signal pattern by the first pitch and from the first dummy pattern by a second pitch which is two times the first pitch, the third dummy pattern extending in the first horizontal direction; and
placing a fourth dummy pattern which is spaced apart from the second signal pattern by the first pitch and the second dummy pattern by the second pitch, the fourth dummy pattern extending in the first horizontal direction.

14. The method of claim 10, wherein the placing of the first signal pattern and the second signal pattern comprises placing the first signal pattern and the second signal pattern to be spaced apart from each other by the first pitch.

15. The method of claim 10,
wherein the placing of the first dummy pattern comprises determining a width of the first dummy pattern, based on a width of the first signal pattern and the first pitch, and
wherein the placing of the second dummy pattern comprises determining a width of the second dummy pattern, based on a width of the second signal pattern and the first pitch.

16. The method of claim 10, further comprising:
forming a fuse in the conductive layer,
wherein the forming of the fuse comprises:
placing a pair of dummy patterns spaced apart from each other by a second pitch which is two times the first pitch, and
placing a fuse pattern extending by passing through a region between the pair of dummy patterns.

17. A method of manufacturing an integrated circuit, the method comprising:
obtaining information about a signal pattern comprised in a critical path;
placing in a conductive layer of a design layout the signal pattern extending in a first horizontal direction;
after placing the signal pattern, placing in the conductive layer of the design layout a first dummy pattern which is spaced apart from the signal pattern by a first pitch and extends in the first horizontal direction; and
forming the integrated circuit based on the design layout, the integrated circuit comprising a signal pattern that corresponds to the signal pattern of the design layout and a first dummy pattern that corresponds to the first dummy pattern of the design layout,
wherein the first pitch corresponds to a pitch between a mandrel pattern and a non-mandrel pattern, and wherein the placing of the first dummy pattern comprises determining a width of the first dummy pattern, based on a width of the signal pattern and the first pitch.

18. The method of claim 17, wherein the first dummy pattern is configured to be electrically floated, or wherein the first dummy pattern is configured so that a constant potential or a normal signal is applied thereto.

19. The method of claim 17, wherein a length of the first dummy pattern in the first horizontal direction is equal to or greater than a length of the signal pattern in the first horizontal direction.

20. The method of claim 17, further comprising:

placing in the design layout a second dummy pattern which is spaced apart from the signal pattern by the first pitch and spaced apart from the first dummy pattern by a second pitch which is two times the first pitch, the second dummy pattern extending in the first horizontal direction.

\* \* \* \* \*